(12) United States Patent
Tsai et al.

(10) Patent No.: US 7,939,451 B2
(45) Date of Patent: May 10, 2011

(54) METHOD FOR FABRICATING A PATTERN

(75) Inventors: Shih-Chang Tsai, Hsinchu (TW);
Chun-Hung Lee, Hsinchu (TW);
Ming-Cheng Deng, Hsinchu (TW);
Ta-Hung Yang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 786 days.

(21) Appl. No.: 11/759,622

(22) Filed: Jun. 7, 2007

(65) Prior Publication Data
US 2008/0305635 A1    Dec. 11, 2008

(51) Int. Cl.
*H01L 21/302* (2006.01)
(52) U.S. Cl. ........ 438/717; 438/723; 438/724; 438/736; 438/756; 438/757
(58) Field of Classification Search .......... 438/717, 438/723, 724, 736, 756, 757
See application file for complete search history.

(56) References Cited

U.S. PATENT DOCUMENTS

| 6,638,441 | B2 | 10/2003 | Chang et al. | |
| 6,734,107 | B2 | 5/2004 | Lai et al. | |
| 2005/0272259 | A1 | 12/2005 | Hong | |
| 2006/0068596 | A1* | 3/2006 | Dobuzinsky et al. | 438/740 |
| 2006/0240361 | A1* | 10/2006 | Lee et al. | 430/313 |
| 2008/0054483 | A1* | 3/2008 | Lee et al. | 257/774 |
| 2008/0122125 | A1* | 5/2008 | Zhou | 257/797 |

FOREIGN PATENT DOCUMENTS

TW     200701439     1/2007

OTHER PUBLICATIONS

Chinese Examination Report of Taiwan Application No. 096119575, dated Jul. 19, 2010.

* cited by examiner

*Primary Examiner* — Binh X Tran
(74) *Attorney, Agent, or Firm* — J.C. Patents

(57) ABSTRACT

A method for fabricating a patter is provided as followed. First, a material layer is provided, whereon a patterned hard mask layer is formed. A spacer is deposited on the sidewalls of the patterned hard mask layer. Then, the patterned hard mask layer is removed, and an opening is formed between the adjacent spacers. Afterwards, a portion of the material layer is removed to form a patterned material layer by using the spacer as mask.

18 Claims, 6 Drawing Sheets

METHOD FOR FABRICATING A PATTERN

BACKGROUND OF THE INVENTION

1. Field of the Invention

The present invention relates to a method for fabricating a pattern, and more particularly, to a method for fabricating a pattern having equal width and spacing.

2. Description of Related Art

As the level of integration of integrated circuits (IC) continues to increase, the size of each semiconductor device and the distance between the semiconductor devices in integrated circuits must be reduced. In other words, to increase the packaging density of devices and the integration of integrated circuits, the pitch of the pattern, that is the sum of the width and spacing of the pattern, must be reduced. Generally, the miniaturization of pattern pitch in IC fabrication is mostly done by lithography having high resolution. In other words, the width and spacing are determined by the photoresist layer that has been exposed and developed.

Using a light source with a shorter wavelength is one way to improve the resolution. Currently, the 193 nm (ArF) lithography is the shortest wavelength of light that has been developed and a more advanced lithography fabrication is under development. However, there are limiting factors in 193 nm lithography, including the development for the fabrication of photomasks and photoresist materials. As a result, 193 nm lithography encounters problems such as low resolution and poor quality of photoresist pattern. Moreover, 193 nm lithography is limited by optics per se. Hence, the technology is relatively complex and the manufacturing cost is relatively high. Therefore, 248 nm (KrF) lithography is more conunonly used by the industry. Nonetheless, 248 nm lithography, combined with other resolution enhancement techniques, cannot be extended to below 100 nm width. Furthermore, the tools and materials used in today's improved lithographic system required by the lithographic fabrication add on to the manufacturing costs. Consequently, as the semiconductor fabrication technique is required to increase of the integration of device, the industry aims to resolve the aforementioned issues encountered in the fabrication process.

SUMMARY OF THE INVENTION

Accordingly, the present invention provides a method for fabricating a pattern intended to miniaturize the pitch of the pattern.

The present invention also provides a method for fabricating a pattern having equal width and spacing.

The present invention provides a method for fabricating a pattern, which includes the following steps. First, it provides a material layer and a patterned hard mask layer is formed on the material layer. Next, a spacer is formed on the sidewalls of the patterned hard mask layer. Thereafter, the patterned hard mask layer is removed and an opening is formed between the adjacent spacers. Then, a portion of the material layer is removed to form a patterned material layer by using the spacer as mask.

In one embodiment of the present invention, the method for forming the spacer includes the following steps. First, a spacer material layer is formed on the material layer, wherein the spacer material layer conformably covers the patterned hard mask layer. Then, an anisotropic etching process is performed to remove a portion of the spacer material layer.

In one embodiment of the present invention, the spacer, the patterned hard mask layer and the material layer have different etch selectivities.

In one embodiment of the present invention, the method for fabricating a pattern further includes a step of removing the spacer.

In one embodiment of the present invention, the method for fabricating the patterned hard mask layer includes following steps. First, a hard mask layer and a patterned photoresist layer are formed on the material layer. Next, the hard mask layer is removed by using the patterned photoresist layer as a mask to expose the surface of the material layer. Next, the patterned photoresist layer is removed.

In one embodiment of the present invention, the material layer can be a polysilicon layer, a dielectric layer or a metal layer and the materials for fabricating the hard mask layer can be either nitrides or oxides.

In one embodiment of the present invention, the method for fabricating a pattern further includes a step of forming a mask layer between the material layer and the patterned hard mask layer. Moreover, the spacer material layer, the patterned hard mask layer and the mask layer have different etch selectivities. In addition, the spacer material layer and the material layer can be polysilicon layers. The materials for fabricating the hard mask layer can be nitrides, and the materials for fabricating the mask layer can be oxides. On the other hand, the materials for fabricating the hard mask layer can be oxides and the materials for fabricating the mask layer can be nitrides.

The present invention provides another method for fabricating a pattern, which includes the following steps. First, a material layer is provided and a patterned hard mask layer is formed on the material layer, wherein the spacing of the patterned hard mask layer triples the width of the patterned hard mask layer. Next, a spacer is formed on the sidewalls of the patterned hard mask layer and the width of the bottom of the spacer is approximately equal to the width of the patterned hard mask layer. Thereafter, the patterned hard mask layer is removed and an opening is formed between the adjacent spacers. Then, a portion of the material layer is removed to form a patterned material layer by using the spacer as mask and the spacing of the patterned material layer is approximately equal to the width of the patterned material layer.

In one embodiment of the present invention, the method for forming the spacer includes the following steps. First, a spacer material layer is formed on the material layer, wherein the spacer material layer conformably covers the patterned hard mask layer. Then, an anisotropic etching process is performed to remove a portion of the spacer material layer.

In one embodiment of the present invention, the spacer, the patterned hard mask layer and the material layer have different etch selectivities.

In one embodiment of the present invention, the method for fabricating a pattern further includes a step of removing the spacer.

In one embodiment of the present invention, the material layer can be a polysilicon layer, a dielectric layer or a metal layer and the materials for fabricating the hard mask layer can be either nitrides or oxides.

In one embodiment of the present invention, the method for fabricating a pattern further includes a step of forming a mask layer between the material layer and the patterned hard mask layer. Moreover, the spacer material layer, the patterned hard mask layer and the mask layer have different etch selectivities. In addition, the spacer material layer and the material layer can be polysilicon layers. The materials for fabricating the hard mask layer can be nitrides, and the materials for fabricating the mask layer can be oxides. On the other hand, the materials for fabricating the hard mask layer can be oxides and the materials for fabricating the mask layer can be nitrides.

In one embodiment of the present invention, the method for fabricating the patterned hard mask layer includes the following steps. First, a hard mask layer and a patterned photoresist layer are formed on the material layer. Next, a trimming process is performed to make the spacing of the patterned photoresist layer triple the width of the patterned photoresist layer. Then, a portion of the hard mask layer is removed to form a patterned hard mask layer by using the patterned photoresist layer as mask. Afterwards, the patterned photoresist layer is removed.

In the pattern fabrication method of the present invention, first a spacer is formed on the sidewalls of the patterned hard mask layer, then the patterned hard mask layer is removed to form a patterned material layer having smaller width and spacing by using the spacer as mask. In other words, the present invention can miniaturize the pitch of the pattern to increase the integration level of integrated circuits.

On the other hand, in the pattern fabrication method of the present invention, first a patterned hard mask layer having spacing tripled its width is formed and a spacer having equal width and spacing is formed on the patterned hard mask layer. Then, a patterned material layer having equal width and spacing can be formed by using the spacer as mask.

In order to make the aforementioned and other objects, features and advantages of the present invention more comprehensible, preferred embodiments accompanied with figures are described in detail below.

DESCRIPTION OF EMBODIMENTS

FIGS. 1A through 1G are schematic cross-sectional views illustrating the steps of fabricating a pattern according to one embodiment of the present invention.

Figure 1A:
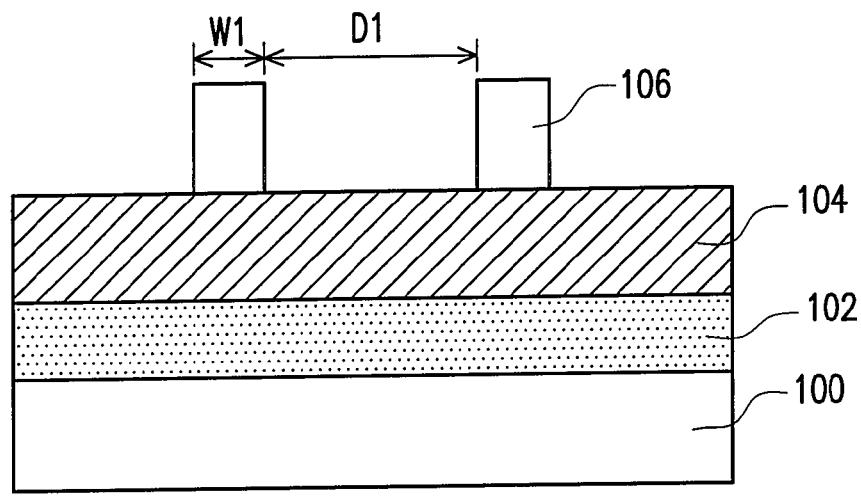
FIGS. 1A through 1G are schematic cross-sectional views illustrating the steps of fabricating a pattern according to one embodiment of the present invention.

First, in FIG. 1A, a material layer 100 is provided. The material layer 100 can be a polysilicon layer, a dielectric layer or a metal layer. The material layer 100 can be fabricated by either a physical vapor deposition (PVD) process or a chemical vapor deposition (CVD) process depending on the materials used. Next, a mask layer 102 is formed on the material layer 100. The mask layer can be fabricated using materials such as nitrides or oxides. The mask layer 102 can be fabricated by a chemical vapor deposition process. Thereafter, a hard mask layer 104 is formed on the mask layer 102. The hard mask layer 104 can be fabricated using materials such as nitrides or oxides. The mask layer 104 can be fabricated by a chemical vapor deposition process. It should be noted that the mask layer 102 and the hard mask layer 104 have different etch selectivities. Afterwards, a patterned photoresist layer 106 is formed on the hard mask layer 104. The patterned photoresist layer 106 can be fabricated by lithography.

Then, a trimming process is performed to the patterned photoresist layer 106 to make its spacing D1 triple its width W1. It should be mentioned that, in the present embodiment, the patterned photoresist layer 106 can be fabricated by 248 nm lithography. Due to the limitations of 248 nm lithography, the width W1 of the untrimmed patterned photoresist layer 106 is, for example, 150 nm, and the width W1 of the trimmed patterned photoresist layer 106 is, for example, 100 nm, which means that the spacing D1 equals to 300 nm.

Figure 1B:
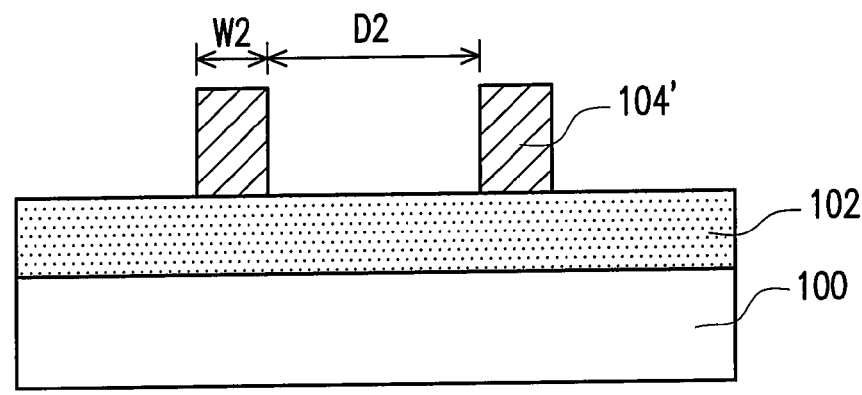

Next, in FIG. 1B, an etching process is performed to the hard mask layer 104 by using the patterned photoresist layer 106 as mask to expose the surface of the mask layer 102 and to form a patterned hard mask layer 104'. Thereafter, the patterned photoresist layer 106 is removed. Since the spacing D1 of the patterned photoresist layer 106 triples the width W1 of the same, the spacing D2 of the patterned hard mask layer 104' triples the width W2 of the same. In other words, in present embodiment, the width W2 of the patterned hard mask layer 104', for example, is 100 nm, the spacing D2 is thus, for example, 300 nm.

Particularly, in other embodiment, the a trimming process is not performed to the patterned photoresist layer 106. The spacing D1 of patterned photoresist layer 106 is larger or smaller then the triple of the width W2 of the same. Furthermore, a patterned hard mask layer 104' having a spacing D2 that triples the width W2 of the same may be formed by other method, such as controlling the parameters of the etching process or performing a trimming process to the patterned hard mask layer 104'. The method for forming patterned hard mask layer 104' having a spacing D2 that triples the width W2 of the same of present invention is not limited by above method.

Figure 1C:
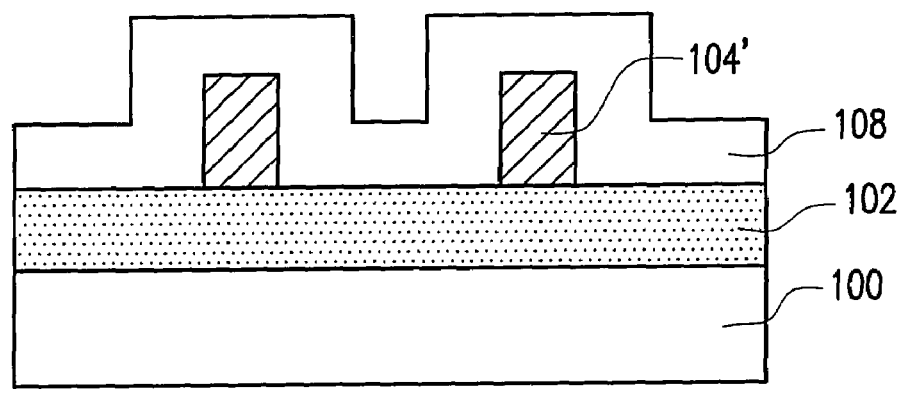

In FIG. 1C, a spacer material layer 108 is formed on the hard mask layer 104, wherein the spacer material layer 108 conformably covers the patterned hard mask layer 104'. The spacer material layer 108 can be fabricated by a chemical vapor deposition process. The spacer material layer 108, the patterned hard mask layer 104' and the mask layer 102 have different etch selectivities. In the present embodiment, the spacer material layer 108 and the material layer 100 are polysilicon layers. The materials for fabricating the patterned hard mask layer 104' can be nitrides, and the materials for fabricating the mask layer 102 can be oxides. On the other hand, the materials for fabricating the patterned hard mask layer can be oxides and the materials for fabricating the mask layer can be nitrides.

Figure 1D:
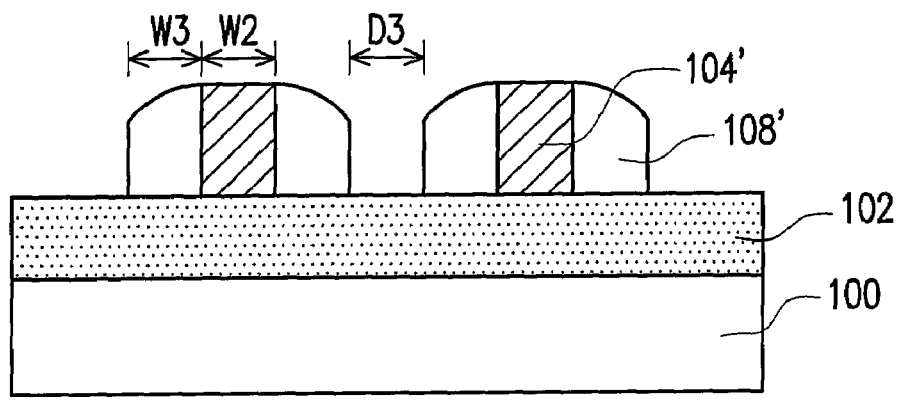

Next, in FIG. 1D, an anisotropic etching process is performed to remove a portion of the spacer material layer 108 and a spacer 108' is formed on the sidewalls of the patterned hard mask layer 104'. The width W3 of the bottom of the spacer 108' is approximately equal to the width W2 of the patterned hard mask layer 104'. Since the spacing D2 of the patterned hard mask layer 104' triples the width W2 of the same and the width W3 of the bottom of the spacer 108' is approximately equal to the width W2 of the patterned hard mask layer 104', the distance D3 between the adjacent spacers 108' of the adjacent patterns deposited on the patterned hard mask layer 104' is equal to the width W2 of the patterned hard mask layer 104'. In the present embodiment, the width W3 of the bottom of the spacer 108' and the distance D3 between the adjacent spacers 108' are, for example 100 nm.

Figure 1E:
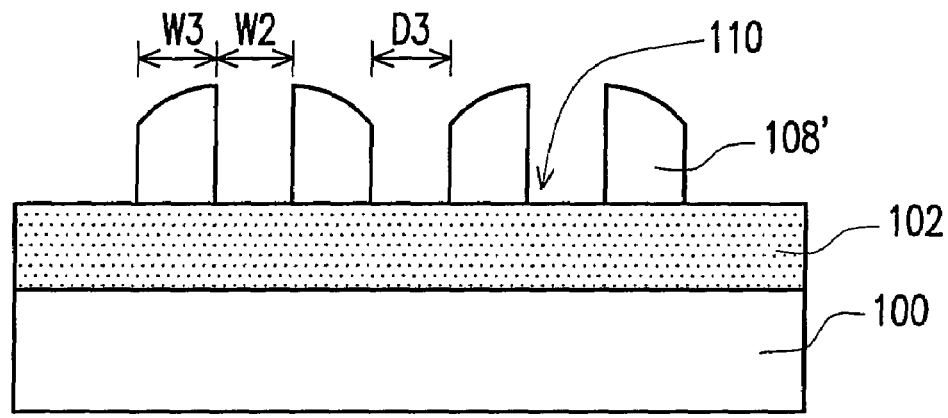

Next, in FIG. 1E, the patterned hard mask layer 104' is removed and an opening 110 having a width W2 is formed between the adjacent spacers 108'. The patterned hard mask layer 104' can be removed by performing wet etching process.

Figure 1F:
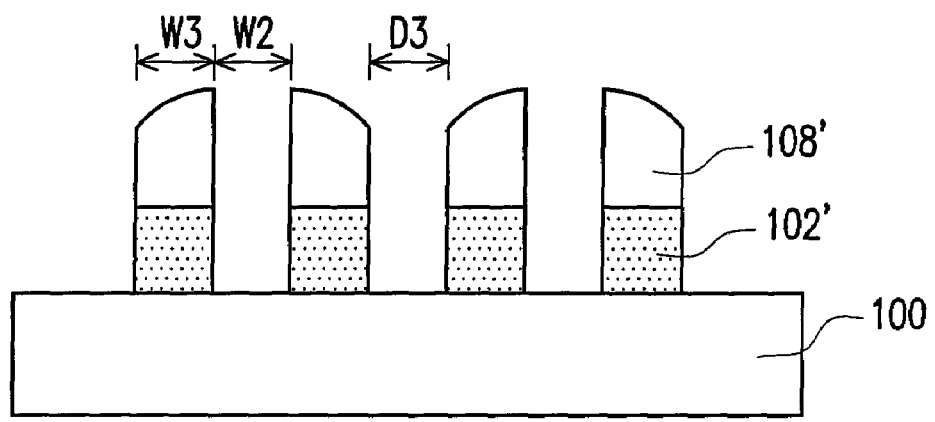

In FIG. 1F, an etching process is performed to remove a portion of the mask layer 102 by using the spacer 108' as mask to form a patterned mask layer 102'.

Figure 1G:
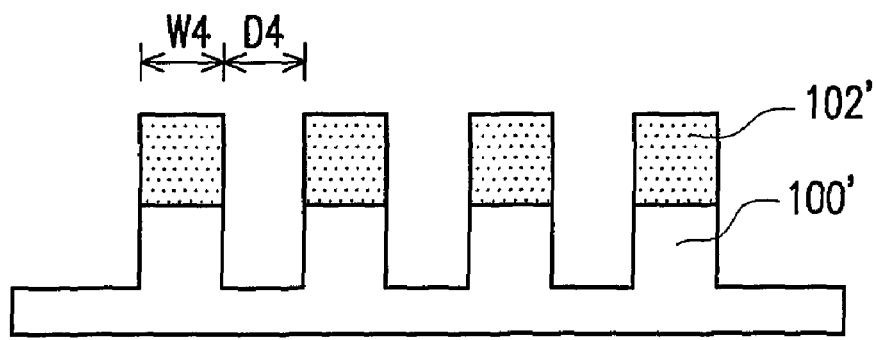

Thereafter, in FIG. 1G, an etching process is performed to remove a portion of the material layer 100 by using the spacer 108' and the patterned mask layer 102' as mask to form a patterned material layer 100'. In the present embodiment, since the width W3 of the bottom of the spacer 108', the width of the opening 110 and the distance D3 between the adjacent spacers are all, for example, 100 nm, the width W4 of the patterned material layer 100' formed is equal to its spacing D4, which are both, for example, 100 nm. Further, the spacer 108' and the material layer 100 can both be fabricated using materials such as polysilicon. Therefore, when an etching process is performed to remove a portion of the material layer 100, the spacer 108' can be removed at the same time since they are fabricated using the same materials. Since the spacer 108' and the patterned mask layer 102' have different etch selectivities, the patterned mask layer 102' can be designated as the etch stop layer.

Accordingly, the pattern fabrication method of the present invention can remove the patterned hard layer 104' after the deposition of the spacer 108' on the sidewalls of the patterned hard mask layer 104'. Next, using the spacer 108' as mask, a patterned material layer 100' having equal width W4 and spacing D4 is formed.

Another embodiment of the present invention is illustrated as follows. FIGS. 2A through 2E are schematic cross-sectional views illustrating the steps for fabricating a pattern according to another embodiment of the present invention.

Figure 2A:
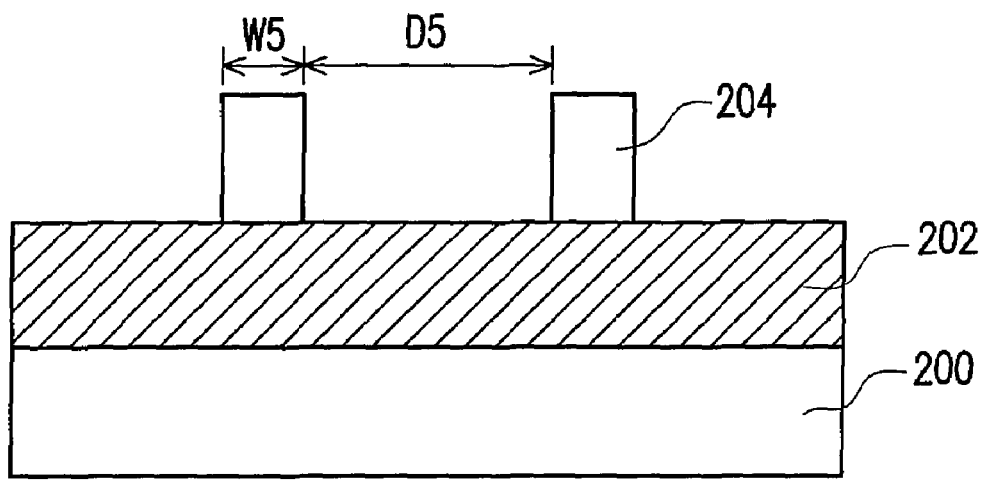
FIGS. 2A through 2E are schematic cross-sectional views illustrating the steps for fabricating a pattern according to another embodiment of the present invention.

In FIG. 2A, in another embodiment, a material layer 200 is provided. The material layer 200 can be a polysilicon layer, a dielectric layer or a metal layer. The material layer 200 can be fabricated by either a physical vapor deposition (PVD) process or a chemical vapor deposition (CVD) process depending on the materials used. Next, a mask layer 202 is formed on the material layer 200. The hard mask layer 202 can be fabricated using materials such as nitrides or oxides. The mask layer 202 can be fabricated by a chemical vapor deposition process. Then, a patterned photoresist layer 204 is formed on the hard mask layer 202. The patterned photoresist layer 204 can be fabricated by lithography.

Thereafter, a trimming process is performed to the patterned photoresist layer 204 to make its spacing D5 triple its width W5. Since the patterned photoresist layer 204 is fabricated by, for example, 248 nm lithography, the untrimmed width of the patterned photoresist layer 204 is, for example, 150 nm. The trimmed width W5 is, for example, 100 nm, and the spacing D5, is for example, 300 nm.

Figure 2B:
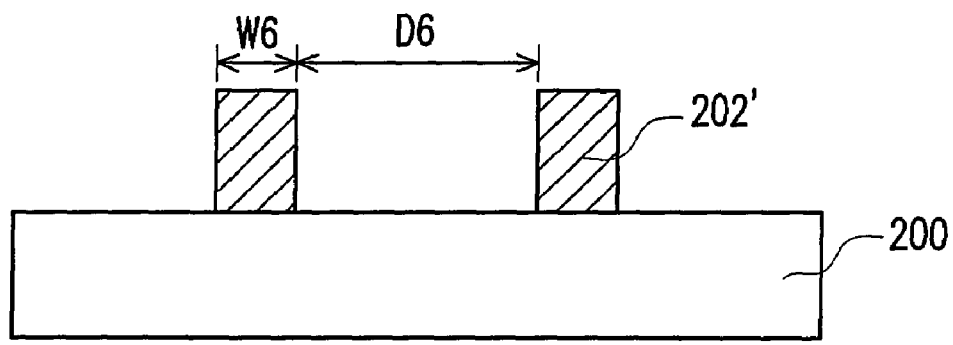

Next, in FIG. 2B, an etching process is performed to the hard mask layer 202 by using the patterned photoresist layer 204 as mask to expose the surface of the material layer 200 and to form a patterned hard mask layer 202'. Then, the patterned photoresist layer 204 is removed. The spacing D6 of the patterned hard mask layer 202' triples its width W6. In other words, if the width W6 of the patterned hard mask layer is 100 nm, its spacing D6 would be 300 nm.

Particularly, in other embodiment, the trimming process is not performed to the patterned photoresist layer 204. The spacing D6 of patterned photoresist layer 204 is larger or smaller then the triple of the width W6 of the same. Furthermore, a patterned hard mask layer 202' having a spacing D5 that triples the width W5 of the same may be formed by other method, such as controlling the parameters of the etching process or performing a trimming process to the patterned hard mask layer 202'. The method for forming patterned hard mask layer 202' having spacing D5 that triples the width W5 of the same of present invention is not limited by above method.

Figure 2C:
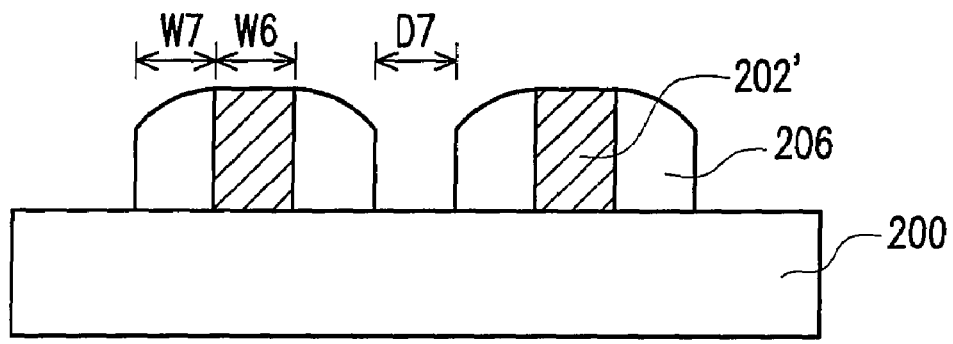

Next, in FIG. 2C, a spacer material layer (not shown) is formed on the material layer 200, wherein the spacer material layer conformably covers the patterned hard mask layer 202'. The spacer material layer can be fabricated by a chemical vapor deposition process. The spacer material layer, the patterned hard mask layer 202' and the material layer 200 have different etch selectivities. Thereafter, an anisotropic etching process is performed to remove a portion of the spacer material layer and a spacer 206 is deposited on the sidewalls of the patterned hard mask layer 202'. The width W7 of the bottom of the spacer 206 is approximately equal to the width W6 of the patterned hard mask layer 202'. Since the spacing D6 of the patterned hard mask layer 202' triples the width W6 of the same and the width W7 of the bottom of the spacer 206 is approximately equal to the width W6 of the patterned hard mask layer 202', the distance D7 between the adjacent spacers 206 of the adjacent patterns deposited on the patterned hard mask layer 202' is equal to the width W6 of the patterned hard mask layer 202'. In other words, the width W7 of the bottom of the spacer 206 and the distance D7 between the adjacent spacers 206 are, for example 100 nm.

Figure 2D:
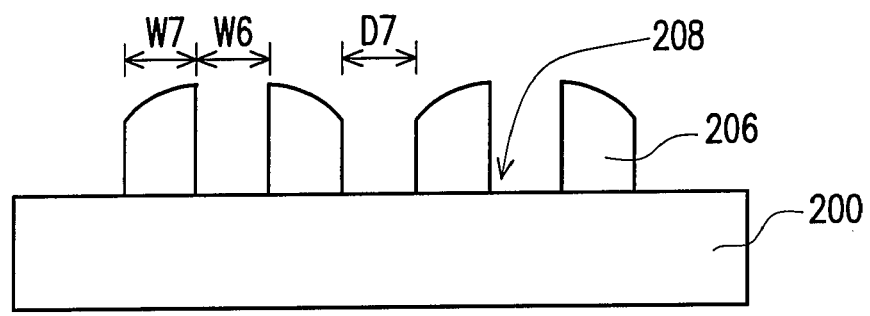
Figure 2E:
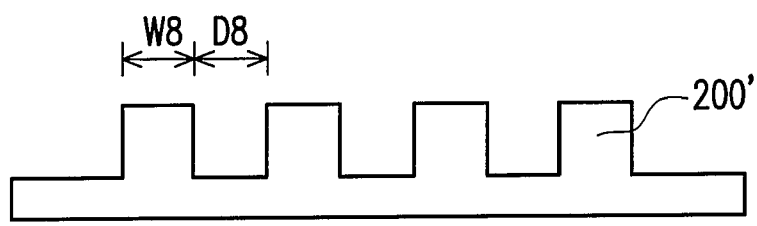

Next, in FIG. 2D, the patterned hard mask layer 202' is removed and an opening 208 having a width W6 is formed between the adjacent spacers 206. In the present embodiment, since the width W7 of the bottom of the spacer 206, the width of the opening 208 and the distance D3 between the adjacent spacers are all, for example, 100 nm, the width W8 of the patterned material layer 200' formed is equal to its spacing D8, which are both, for example, 100 nm. Thereafter, the spacer 206 is removed, which forms a pattern having equal width and spacing according to another embodiment of the present invention.

Accordingly, the pattern fabrication method of the present invention removes the patterned hard mask layer after the deposition of the spacer on the sidewalls of the patterned hard mask layer and forms the patterned material layer using the spacer as mask. Hence, the width and the spacing of the patterned material layer fabricated can be effectively miniaturized.

Besides, the present invention deposits the spacer on the sidewalls of the patterned hard mask layer having its spacing tripled its width and removes the patterned hard mask layer to obtain a spacer having equal width and spacing. Thereafter, a patterned material layer having equal width and spacing can be formed by using the spacer as mask.

It should be noted that the present invention uses 248 nm lithography to fabricate a pattern having both width and spacing equal to 100 nm. In other words, the tools and techniques of today's 248 nm lithography can be utilized to obtain the width of the pattern achieved by 193 nm lithography. Hence, the present invention overcomes the limitations encountered by today's 193 nm lithography by fabricating a pattern with smaller pitch and forming images with improved quality. Moreover, the present invention does not only apply in 248 nm lithography. It can further apply in 193 nm lithography, overcoming the limitation of the width for the lithography in the next generation.

On the other hand, the pattern fabrication method of the present invention can achieve the pattern width of the next generation lithography using today's lithographic techniques and fabrication tools without the use of new tools, photo masks and photoresist materials. Hence, the present invention can fabricate patterns having smaller pitch using simple fabrication steps which lowers the manufacturing costs thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a pattern, comprising:
   providing a material layer;
   forming a patterned hard mask layer on the material layer;
   forming a mask layer between the material layer and the patterned hard mask layer;
   forming a spacer on the sidewalls of the patterned hard mask layer;
   removing the patterned hard mask layer to form an opening between the adjacent spacers; and
   removing a portion of the mask layer and a portion of the material layer to form a patterned mask layer and a patterned material layer by using the spacer as mask,
   wherein the spacer, the patterned hard mask layer and the mask layer have different etch selectivities, and the spacer comprises polysilicon.

2. The method of claim 1, wherein the method for fabricating the spacer comprises:
   forming a spacer material on the material layer, wherein the spacer material conformably covers the patterned hard mask layer; and
   performing an anisotropic etching process to remove a portion of the spacer material.

3. The method of claim 1, wherein the spacer, the patterned hard mask layer and the material layer have different etch selectivities.

4. The method of claim 1, further comprising removing the spacer.

5. The method of claim 1, wherein the method for fabricating the patterned hard mask layer comprises:
   forming a hard mask layer and a patterned photoresist layer on the material layer;
   removing the hard mask layer to expose the surface of the material layer by using the patterned photoresist layer as mask; and
   removing the patterned photoresist layer.

6. The method of claim 1, wherein the material layer comprises a polysilicon layer, a dielectric layer or a metal layer.

7. The method of claim 1, wherein the hard mask layer is fabricated using materials comprising nitrides or oxides.

8. The method of claim 1, wherein the hard mask layer is fabricated using materials comprising nitrides and the mask layer is fabricated using materials comprising oxides.

9. The method of claim 1, wherein the hard mask layer is fabricated using materials comprising oxides and the mask layer is fabricated using materials comprising nitrides.

10. A method for fabricating a pattern, comprising:
    providing a material layer;
    forming a patterned hard mask layer on the material layer, wherein one spacing of the patterned hard mask layer triples one width of the patterned hard mask layer;
    forming a mask layer between the material layer and the patterned hard mask layer;
    forming a spacer on the sidewalls of the patterned hard mask layer and the width of the bottom of the spacer is approximately equal to one width of the patterned hard mask layer;
    removing the patterned hard mask layer to form an opening between the adjacent spacers; and
    removing a portion of the mask layer and a portion of the material layer to form a patterned mask layer and a patterned material layer by using the spacer as mask and one spacing of the patterned material layer is approximately equal to one width of the patterned material layer,
    wherein the spacer, the patterned hard mask layer and the mask layer have different etch selectivities, and the spacer comprises polysilicon layer.

11. The method of claim 10, wherein the method for fabricating the spacer comprises:
    forming a spacer material on the material layer, wherein the spacer material conformably covers the patterned hard mask layer; and
    performing an anisotropic etching process to remove a portion of the spacer material.

12. The method of claim 10, wherein the spacer, the patterned hard mask layer and the material layer have different etch selectivities.

13. The method of claim 10, further comprising removing the spacer.

14. The method of claim 10, wherein the material layer comprises a polysilicon layer, a dielectric layer or a metal layer.

15. The method of claim 10, wherein the hard mask layer is fabricated using materials comprising nitrides or oxides.

16. The method of claim 10, wherein the hard mask layer is fabricated using materials comprising nitrides and the mask layer is fabricated using materials comprising oxides.

17. The method of claim 10, wherein the hard mask layer is fabricated using materials comprising oxides and the mask layer is fabricated using materials comprising nitrides.

18. The method of claim 10, wherein the method for fabricating the patterned hard mask layer comprises:
    forming a hard mask layer and a patterned photoresist layer on the material layer;
    performing a trimming process to make one spacing of the patterned photoresist layer triple one width of the patterned photoresist layer;
    removing a portion of the hard mask layer to form a patterned hard mask layer by using the patterned photoresist layer as mask; and
    removing the patterned photoresist layer.

* * * * *